(12) United States Patent
Kahn et al.

(10) Patent No.: US 11,352,253 B2
(45) Date of Patent: Jun. 7, 2022

(54) SEMICONDUCTOR DEVICE, MICROPHONE AND METHODS FOR FORMING A SEMICONDUCTOR DEVICE

(71) Applicant: Infineon Technologies AG, Neubiberg (DE)

(72) Inventors: Markus Kahn, Rangersdorf (AT); Anna-Katharina Kaiser, Regen (DE); Soenke Pirk, Villach (AT); Juergen Steinbrenner, Noetsch (AT); Julia-Magdalena Straeussnigg, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/024,029

(22) Filed: Sep. 17, 2020

(65) Prior Publication Data

US 2021/0002132 A1 Jan. 7, 2021

Related U.S. Application Data

(62) Division of application No. 15/901,196, filed on Feb. 21, 2018, now Pat. No. 10,858,246.

(30) Foreign Application Priority Data

Feb. 22, 2017 (DE) .......................... 102017103620.2

(51) Int. Cl.
*B81C 1/00* (2006.01)
*H04R 31/00* (2006.01)
*H04R 19/00* (2006.01)
*H04R 19/04* (2006.01)

(52) U.S. Cl.
CPC ....... *B81C 1/00801* (2013.01); *H04R 19/005* (2013.01); *H04R 19/04* (2013.01); *H04R 31/00* (2013.01); *B81C 2201/0133* (2013.01); *B81C 2201/0176* (2013.01);
(Continued)

(58) Field of Classification Search
CPC ........ B81C 1/00801; B81C 2201/0133; B81C 2201/0176; B81C 2201/053; B81C 2201/056; H04R 19/005; H04R 19/04; H04R 31/00; H04R 2201/003
See application file for complete search history.

(56) References Cited

U.S. PATENT DOCUMENTS

| 5,029,324 A | 7/1991 | Osawa et al. |
| 6,268,295 B1 * | 7/2001 | Ohta ................. H01L 21/28123 438/735 |
| 9,212,051 B1 | 12/2015 | Monadgemi et al. |

(Continued)

FOREIGN PATENT DOCUMENTS

| DE | 3346803 A1 | 7/1984 |
| DE | 10205585 A1 | 8/2003 |

*Primary Examiner* — Mohammad M Choudhry
(74) *Attorney, Agent, or Firm* — Slater Matsil, LLP

(57) ABSTRACT

A semiconductor device comprises a structured metal layer. The structured metal layer lies above a semiconductor substrate. In addition, a thickness of the structured metal layer is more than 100 nm. Furthermore, the semiconductor device comprises a covering layer. The covering layer lies adjacent to at least one part of a front side of the structured metal layer and adjacent to a side wall of the structured metal layer. In addition, the covering layer comprises amorphous silicon carbide.

20 Claims, 5 Drawing Sheets

(52) U.S. Cl.
CPC .. *B81C 2201/053* (2013.01); *B81C 2201/056* (2013.01); *H04R 2201/003* (2013.01)

(56) References Cited

U.S. PATENT DOCUMENTS

| | | |
|---|---|---|
| 2006/0008098 A1 | 1/2006 | Tu |
| 2006/0081987 A1* | 4/2006 | Kobayashi ........ H01L 21/76801 257/751 |
| 2007/0218671 A1 | 9/2007 | Oryoji et al. |
| 2010/0093168 A1* | 4/2010 | Naik ................... H01L 21/7682 438/618 |
| 2012/0146163 A1 | 6/2012 | Ho et al. |
| 2012/0186649 A1 | 7/2012 | Turner et al. |
| 2014/0272583 A1 | 9/2014 | Hellring et al. |
| 2015/0078590 A1 | 3/2015 | Daley et al. |
| 2016/0049463 A1 | 2/2016 | Buchholz et al. |
| 2016/0111373 A1 | 4/2016 | Xie et al. |
| 2016/0314964 A1 | 10/2016 | Tang et al. |

* cited by examiner

SEMICONDUCTOR DEVICE, MICROPHONE AND METHODS FOR FORMING A SEMICONDUCTOR DEVICE

This application is a divisional of U.S. patent application Ser. No. 15/901,196, filed Feb. 21, 2018, which application claims the benefit of German Application No. 102017103620.2, filed on Feb. 22, 2017, which applications are hereby incorporated herein by reference in its entirety.

TECHNICAL FIELD

Examples relate to production technologies for semiconductor devices and in particular to a semiconductor device, to a microphone and to methods for forming a semiconductor device.

BACKGROUND

A semiconductor device often comprises a structured metal layer. It may be desirable to passivate at least parts of the structured metal layer in order to increase a lifetime of the structured metal layer and thus of the semiconductor device.

SUMMARY

Some examples relate to a semiconductor device. The semiconductor device comprises a structured metal layer. The structured metal layer lies above a semiconductor substrate. In addition, a thickness of the structured metal layer is more than 100 nm. Furthermore, the semiconductor device comprises a covering layer. The covering layer lies adjacent to at least one part of a front side of the structured metal layer and adjacent to a side wall of the structured metal layer. In addition, the covering layer comprises amorphous silicon carbide.

Some examples relate to a microphone comprising a semiconductor device.

Some examples relate to a method for forming a semiconductor device. The method comprises forming a structured metal layer above a semiconductor substrate. A thickness of the structured metal layer is more than 100 nm. In addition, the method comprises forming a covering layer after forming the structured metal layer, such that the covering layer lies adjacent to a front side of the structured metal layer and adjacent to a side wall of the structured metal layer. The covering layer comprises amorphous silicon carbide.

Some examples relate to a method for forming a semiconductor device. The method comprises forming a structured metal layer above a semiconductor substrate. A thickness of the structured metal layer is more than 100 nm. In addition, the method comprises forming a covering layer by means of plasma deposition after forming the structured metal layer, such that the covering layer lies adjacent to a front side of the structured metal layer and adjacent to a side wall of the structured metal layer. Helium is used as dilution gas during the plasma deposition.

BRIEF DESCRIPTION OF THE DRAWINGS

Exemplary embodiments are explained in greater detail below with reference to the accompanying figures, in which.

DETAILED DESCRIPTION OF ILLUSTRATIVE EMBODIMENTS

Figure 1:
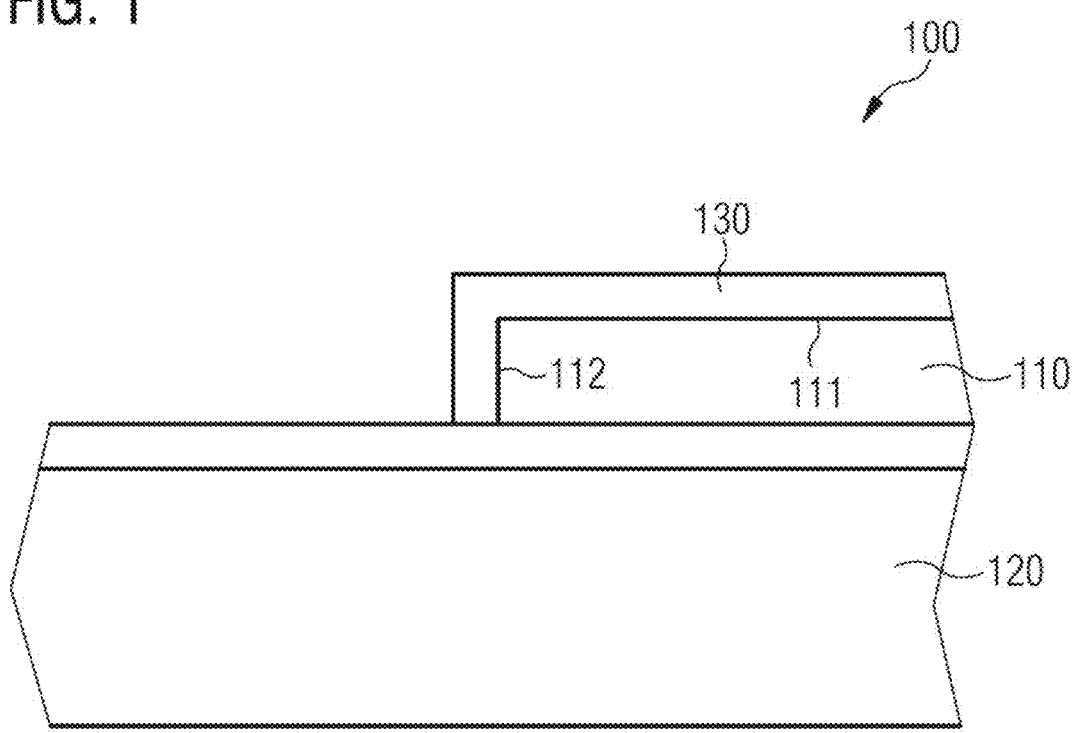
FIG. 1 shows a schematic cross section of part of a semiconductor device.

Various exemplary embodiments will now be described more thoroughly with reference to the accompanying drawings, in which some exemplary embodiments are illustrated. In the figures, the thickness dimensions of lines, layers and/or regions may be illustrated in an exaggerated manner for the sake of clarity.

In the following description of accompanying figures, which merely show some illustrative exemplary embodiments, identical reference signs may designate identical or comparable components. Furthermore, collective reference signs may be used for components and objects which occur multiply in an exemplary embodiment or in a drawing but are described jointly with regard to one or more features. Components or objects described with identical or collective reference signs, with regard to individual, a plurality or all of the features, for example their dimensionings, may be embodied identically, but possibly also differently, unless the description explicitly or implicitly reveals something else.

Although exemplary embodiments may be modified and altered in various ways, exemplary embodiments are illustrated as examples in the figures and are described thoroughly herein. It should be clarified, however, that the intention is not for exemplary embodiments to be restricted to the forms respectively disclosed, rather that exemplary embodiments are intended to cover all functional and/or structural modifications, equivalents and alternatives which lie within the scope of the invention. Identical reference signs designate identical or similar elements throughout the description of the figures.

It should be noted that one element referred to as being "connected" or "coupled" to another element may be directly connected or coupled to the other element or intervening elements may be present. If two elements A and B are combined by an "or", then this should be understood to include all possible combinations, for example "only A", "only B" and "A and B". An alternative formulation for the same combination is "at least one of A and B". The same applies to combinations of more than two elements.

The terminology used herein serves only to describe specific exemplary embodiments and is not intended to restrict the exemplary embodiments. As used herein, the singular forms "a", "an", "one" and "the" are also intended to include the plural forms, as long as the context does not clearly indicate something to the contrary. Furthermore, it should be clarified that the expressions such as e.g. "comprises", "comprising", "has" and/or "having", as used herein, indicate the presence of stated features, integers, steps, work sequences, elements and/or components, but do not preclude the presence or addition of one or a plurality of features, integers, steps, work sequences, elements, components and/or groups thereof.

As long as there is no definition to the contrary, all terms (including technical and scientific terms) used herein have the same meaning ascribed to them by a person of average skill in the art in the field with which the exemplary embodiments are associated. Furthermore, it should be clarified that expressions, e.g. those defined in dictionaries generally used, should be interpreted as if they had the meaning consistent with their meaning in the context of the relevant art, as long as a definition to the contrary is not expressly given herein.

FIG. 1 shows a schematic cross section of part of a semiconductor device 100. The semiconductor device 100 comprises a structured metal layer 110. The structured metal layer 110 lies above a semiconductor substrate 120. In addition, a thickness of the structured metal layer 110 is more than 100 nm (or more than 500 nm or more than 1 µm). Furthermore, the semiconductor device 100 comprises a covering layer 130. The covering layer 130 lies adjacent to at least one part of a front side 111 of the structured metal layer 110 and adjacent to a side wall 112 of the structured metal layer 110. In addition, the covering layer 130 comprises amorphous silicon carbide.

A covering layer comprising amorphous silicon carbide can be produced particularly tightly and/or reliably in comparison with a covering layer composed of a different material. In addition, the use of amorphous silicon carbide as material for the covering layer 130 makes it possible to prevent a seam line from arising in the covering layer 130 at a transition between the front side 111 and the side wall 112 of the structured metal layer 110 or at a steep topography step of the covering layer 130. A passivation of the structured metal layer 110 can be improved as a result. This makes it possible to reduce corrosion of the structured metal layer 110 as a result of subsequent production process steps or during operation. A lifetime of the semiconductor device can be increased as a result. In addition, on account of the reduced corrosion, the structured metal layer 110 can be formed from a cost-effective base metal. A more cost-effective semiconductor device can be provided as a result.

By way of example, the covering layer 130 can be an amorphous silicon carbide layer. The amorphous silicon carbide layer can contain for example at least 50% (or at least 60%, at least 70%, at least 80%, at least 90% or at least 95%) amorphous silicon carbide (a-SiC). By way of example, the amorphous silicon carbide layer can have a 1:1 ratio of carbon (C) to silicon (Si). Alternatively, the amorphous silicon carbide layer can also have other ratios of the elements carbon to silicon, for example 0.8:1.2 or 0.7:1.3). By way of example, the amorphous silicon carbide layer can contain atomic hydrogen (H). The amorphous silicon carbide layer can contain nitrogen (N), for example. By way of example, the amorphous silicon carbide layer can be an amorphous SiC:N layer.

By way of example, the covering layer 130 can be doped or alloyed with all carbide forming substances (for example with chromium (Cr), titanium (Ti), tungsten (W), etc.).

By way of example, the covering layer 130 can be constructed as a multilayer (for example having 1-10000 plies). At least some of the plies of the multilayer can be amorphous silicon carbide plies. By way of example, plies of the multilayer (for example the amorphous silicon carbide plies) can be arranged with many changes of stoichiometry etc., in alternation. The multilayer can comprise for example a combination of amorphous silicon carbide plies or amorphous silicon carbide layers with other plies (for example nitride plies or oxide plies) or layers (for example nitride layers or oxide layers).

By way of example, the covering layer 130 can be an amorphous silicon carbide-like layer which was formed at low temperatures (owing to metallization that is present) and has an excellent edge coverage (for example at a transition between the front side 11 and the side wall 112) without seam lines. Traditional plasma nitrides of silicon can fail here at the edges (for example at a transition between the front side 111 and the side wall 112).

By way of example, the covering layer 130 and/or the amorphous silicon carbide layer can be part of a layer composite.

By way of example, the covering layer 130 can have a thickness of more than 10 nm (or more than 100 nm, more than 1 µm, or more than 10 µm) and/or of less than 200 µm (or less than 100 µm or less than 50 µm). By way of example, an (electrical) resistivity of the covering layer 130 can be more than $1*10^{10}$ Ωcm (or more than $5*10^{10}$ Ωcm) and less than $1*10^{12}$ Ωcm (or less than $5*10^{11}$ Ωcm).

By way of example, the front side 11 of the structured metal layer 110 can be a side of the structured metal layer 110 facing away from the semiconductor substrate 120. A rear side of the structured metal layer 110 can be for example a side of the structured metal layer 110 facing the semiconductor substrate 120. By way of example, the side wall 112 of the structured metal layer 110 can extend from the front side 111 of the structured metal layer 110 as far as the rear side of the structured metal layer 110 or as far as an insulation layer on which the structured metal layer 110 is arranged. The side wall 112 of the structured metal layer 110 can have for example an average gradient angle of more than 20° (or more than 30°, more than 45°, more than 60°, more than 70°, more than 80° or more than 85°). By way of example, the average gradient angle of the side wall 112 can be an angle of the side wall 112 at half the thickness of the structured metal layer 110. The side wall 112 of the structured metal layer 110 can for example be steep or extend almost perpendicularly to the front side 111 of the structured metal layer 110 or a front side of the semiconductor substrate 120. By way of example, the front side 111 of the structured metal layer 110 can extend parallel to the front side of the semiconductor substrate 120. The structured metal layer 110 can form for example a step above the semiconductor substrate 120.

By way of example, the thickness of the structured metal layer 110 can be an average vertical dimension of the structured metal layer 110. The thickness of the structured metal layer 110 can be for example less than 100 µm (or less than 50 µm or less than 10 µm). By way of example, the thickness of the structured metal layer 110 is 1.2 µm.

By way of example, an insulation layer can lie below the structured metal layer 110 and above the semiconductor substrate 120 and thus between the structured metal layer 110 and the semiconductor substrate 120. As a result, the structured metal layer 110 can be electrically insulated from the semiconductor substrate 120 in an efficient manner. By way of example, a thickness of the insulation layer can be more than 1 µm (or more than 10 µm or more than 100 µm). The insulation layer can be for example an oxide layer (for example a silicon oxide (SiO2) layer) or a nitride layer (for example a silicon nitride (Si3N4) layer). By way of example, the structured metal layer 110 can be arranged on the oxide layer or the nitride layer.

By way of example, the structured metal layer 110 can be at least one from an aluminum layer, an aluminum alloy layer, a copper layer and a copper alloy layer. By using a cost-effective material for the structured metal layer 110, it is possible for the semiconductor device 100 to be provided cost-effectively. By way of example, the aluminum layer, the aluminum alloy layer, the copper layer or the copper alloy layer can replace a gold (Au) layer. By way of example, the aluminum layer can contain at least 80% (or at least 90% or at least 95%) aluminum (Al). The copper layer can contain for example at least 80% (or at least 90% or at least 95%) copper (Cu). By way of example, the aluminum alloy layer can be an aluminum-copper (AlCu) layer.

By way of example, the semiconductor device 100 can furthermore comprise a microelectromechanical element. The structured metal layer 110 can form a connection pad (for example a bond pad) for the electrical contacting of the microelectromechanical element. By way of example, the semiconductor device 100 can form a Micro-Electro-Mechanical System (MEMS) device or be an element of a MEMS device (for example of a microphone or of a pressure sensor). Alternatively, part of the semiconductor device 100 can be put at a specific potential (for example at a ground potential) via the structured metal pad 110. For this purpose, the structured metal pad 110 can be electrically conductively connected to a control circuit and the part of the semiconductor device 100.

By way of example, the microelectromechanical element can comprise a membrane structure. The membrane structure can be arranged above a cutout formed in or on the semiconductor substrate 120. The covering layer 130 can be used as a protective layer for the structured metal layer 110 during a process of forming the cutout in the semiconductor substrate 120 (for example by means of an etching process) or removing a sacrificial layer below the membrane in order to free the membrane. It is thereby possible to increase a yield when forming a semiconductor device 100. As a result, the semiconductor device 100 can be provided cost-effectively. By way of example, the membrane structure can be a silicon membrane. Alternatively or additionally, the microelectromechanical element can comprise a MEMS oscillator and/or a MEMS gyroscope.

By way of example, the semiconductor device 100 can furthermore comprise a bond structure in contact with the structured metal layer 110. By way of example, the bond structure can comprise a bond wire or a solder ball. Part of the front side 111 of the structured metal layer 110 can be free of the covering layer 130, for example, in order to be able to bring the bond structure into contact with the structured metal layer 110.

By way of example, the semiconductor substrate 120 can be a silicon (Si)-based semiconductor substrate. Alternatively, the semiconductor substrate 120 can be a silicon carbide (SiC)-based semiconductor substrate, a gallium arsenide (GaAs)-based semiconductor substrate or a gallium nitride (GaN)-based semiconductor substrate. The semiconductor substrate 120 can be for example a semiconductor wafer or a semiconductor slice.

By way of example, a vertical direction, a vertical dimension or a thickness can be measured perpendicularly to the front side of the structured metal layer 110 or perpendicularly to a surface of the semiconductor substrate 120 and a lateral direction or a lateral dimension can be measured parallel to the front side of the structured metal layer 110 or to the surface of the semiconductor substrate 120. A front side of the semiconductor substrate 120 can be for example a surface of the semiconductor substrate 120 on which structures that are intended to be produced are more complex than those on a rear side of the semiconductor substrate 120 since process parameters (for example a temperature) and a treatment of the rear side may be restricted if structures have already been formed on the front side.

By way of example, the semiconductor device 100 can be a microphone, a sensor component (for example a pressure sensor or an acceleration sensor), a MEMS component, a processor or a memory component.

Figure 2:
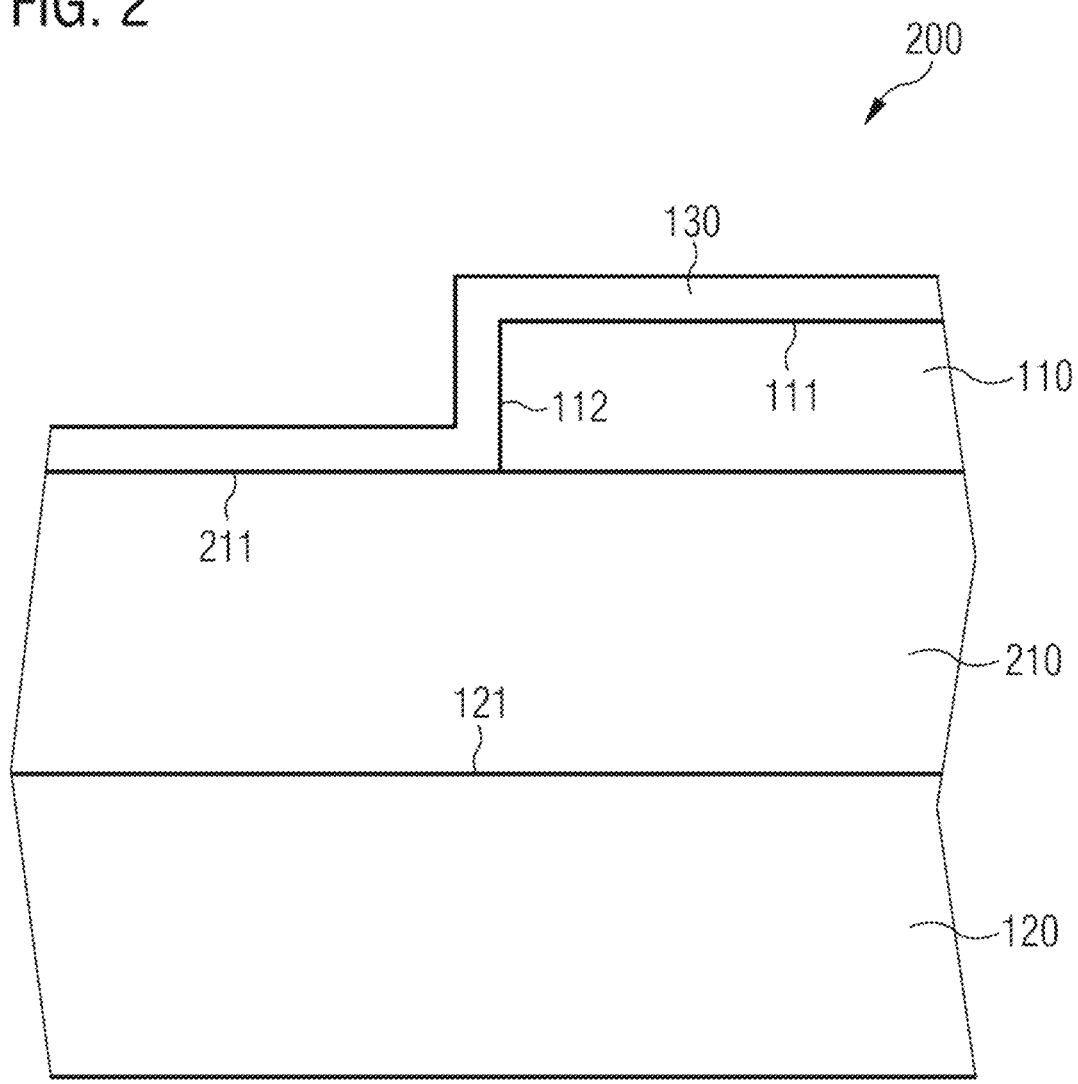
FIG. 2 shows a schematic cross section of part of a further semiconductor device.

FIG. 2 shows a schematic cross section of part of a further semiconductor device 200. The semiconductor device 200 can be embodied similarly to the semiconductor device 100 described in association with FIG. 1. The semiconductor device 200 comprises a semiconductor substrate 120. By way of example, the semiconductor substrate 120 can be a silicon substrate. An oxide layer 210 lies adjacent to a front side 121 of the semiconductor substrate 120. By way of example, the oxide layer 210 can be a silicon oxide layer. In addition, a structured metal layer 110 lies adjacent to a surface 211 of the oxide layer 210. By way of example, the structured metal layer 110 can be an aluminum layer. The structured metal layer 110 can form a step, for example. Furthermore, a covering layer 130 lies adjacent to a front side 111 of the structured metal layer 110, adjacent to a side wall 112 of the structured metal layer 110 and adjacent to the surface 211 of the oxide layer 210. The covering layer 130 can comprise amorphous silicon carbide for example.

FIG. 2 shows an example of a step covering of amorphous silicon carbide (SiC) on aluminum (Al).

By way of example, before release etching of the semiconductor device 200 (for example for a MEMS product such as a silicon (Si) microphone having aluminum (Al) metallization), it is possible to carry out a tight covering of the structured metal layer 110 or of steps with steep side walls of metal connection pads. In this case, production of seam lines at topography steps can be avoided or at least reduced. Such seam lines are often not tight, for which reason the structured metal layer 110 (for example an aluminum (Al) step), during the release etching (for example by means of a buffered oxide etch), with seam lines possibly present, can be attacked by the etchant used (for example FAEL).

By way of example, the covering layer 130 can comprise plasma-deposited amorphous silicon carbide (SiC). By means of the plasma-deposited amorphous silicon carbide, it is possible to achieve a tight covering of the structured metal layer 110 or of metal steps during the release etching process. This makes it possible to prevent the structured metal layer 110 or a metal connection pad from being attacked by an etchant (for example FAEL) during the release etching. Furthermore, the covering layer 130 (for example a SiC film) can also be used as passivation (for example of the structured metal layer 110).

Further details and aspects will be mentioned in association with the embodiments described above or below. The embodiment shown in FIG. 2 can comprise one or more optional additional features corresponding to one or more aspects mentioned in connection with the proposed concept or one or more of the embodiments described above (for example FIG. 1) or below (for example FIGS. 3-6).

Figure 3:
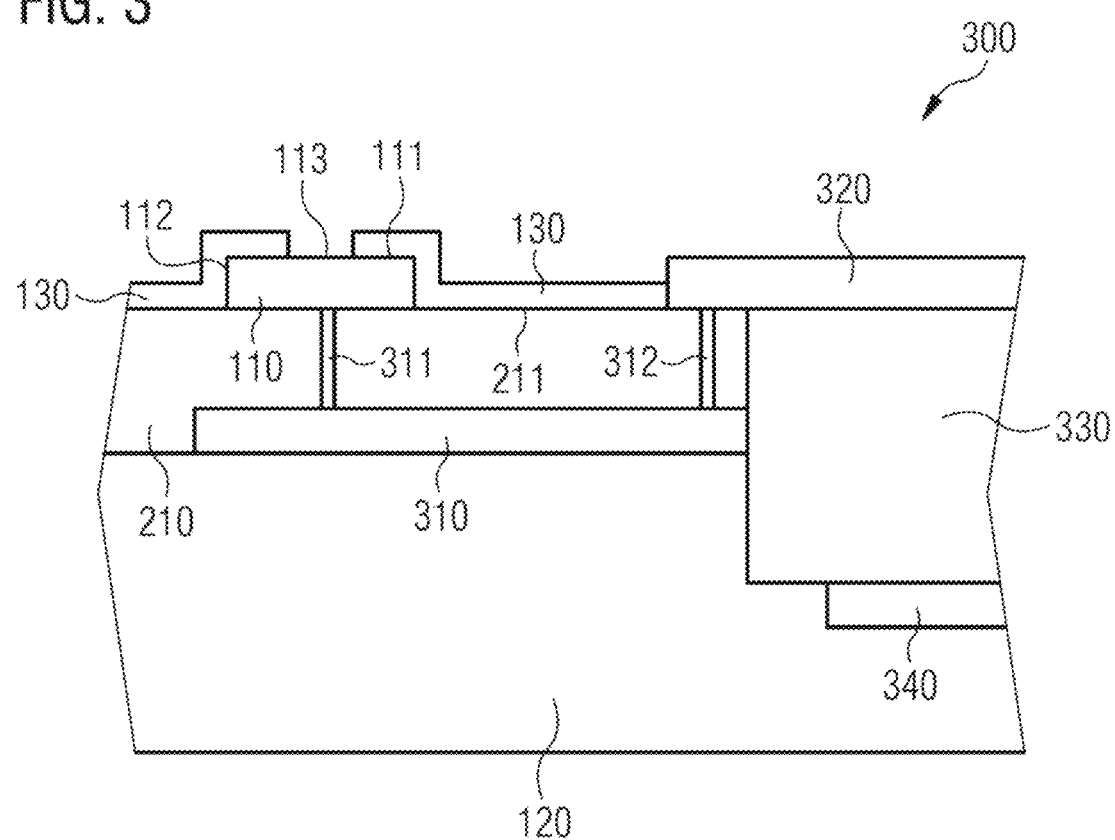
FIG. 3 shows a schematic cross section of part of a microphone.

FIG. 3 shows a schematic cross section of part of a microphone 300. The microphone 300 comprises a semiconductor device. The semiconductor device can be embodied similarly to the semiconductor device 100 described in association with FIG. 1 or the semiconductor device 200 described in association with FIG. 2. The microphone 300 comprises a semiconductor substrate 120. By way of example, the semiconductor substrate 120 can be a silicon substrate. An oxide layer 210 lies adjacent to the semiconductor substrate 120. By way of example, the oxide layer 210 can be a silicon oxide layer. In addition, a structured metal layer 110 lies adjacent to the oxide layer 210. By way of example the structured metal layer 110 can be an aluminum layer. Furthermore, a covering layer 130 lies adjacent to the structured metal layer 110 and adjacent to the oxide layer 210. The covering layer 130 covers the side walls 112 of the structured metal layer 110, a first part of a front side 111 of the structured metal layer 110 and a surface 211 of the oxide layer 210. A second part 113 of the front side 111 of the structured metal layer 110 is not covered by the covering layer 130. By way of example, the second part 113 of the front side 111 of the structured metal layer 110 can be brought into contact with a bond structure. Furthermore, an electrical connection structure 310 situated at the oxide layer 210 is electrically conductively connected to the structured metal layer 110 by means of a first via 311. The electrical connection structure 310 is electrically conductively connected to a membrane structure 320 of the microphone 300 by means of a second via 312. By way of example, the electrical connection structure 310 can comprise an electrically conductive material (for example aluminum, copper or polysilicon). As a result, the electrical connection structure 310 can electrically conductively connect the structured metal layer 110 to the membrane structure 320. The structured metal layer 110 can thereby form a connection pad or a terminal pad for the membrane structure 320. The membrane structure 320 is arranged above a cutout 330 formed in the semiconductor substrate 120 and the oxide layer 210. By way of example, the cutout 220 can form a cavity below the membrane structure 320. In the example shown in FIG. 3, the semiconductor substrate 120 additionally forms a base of the cutout 330. Alternatively, the cutout 330 can penetrate completely through the semiconductor substrate 120. Furthermore, the microphone 300 comprises a counterelectrode 340 situated at the base of the cutout 330.

By way of example, the microphone 300 can be a capacitor microphone. The membrane structure 320 and the counterelectrode 340 can form a capacitor. In the event of sound waves impinging on the membrane structure 320, the latter can be caused to oscillate. A capacitance of the capacitor can change as a result of the oscillation of the membrane structure 320. The microphone 300 can additionally comprise an evaluation circuit for detecting the change in the capacitance of the capacitor and for generating an analog or digital electrical signal representing the detected change in the capacitance and thus the impinging sound waves. The evaluation circuit can be implemented on the semiconductor substrate 120 or be an external circuit.

Further details and aspects will be mentioned in association with the embodiments described above or below. The embodiment shown in FIG. 3 can comprise one or more optional additional features corresponding to one or more aspects mentioned in connection with the proposed concept or one or more of the embodiments described above (for example FIGS. 1-2) or below (for example FIGS. 4-6).

Figure 4:
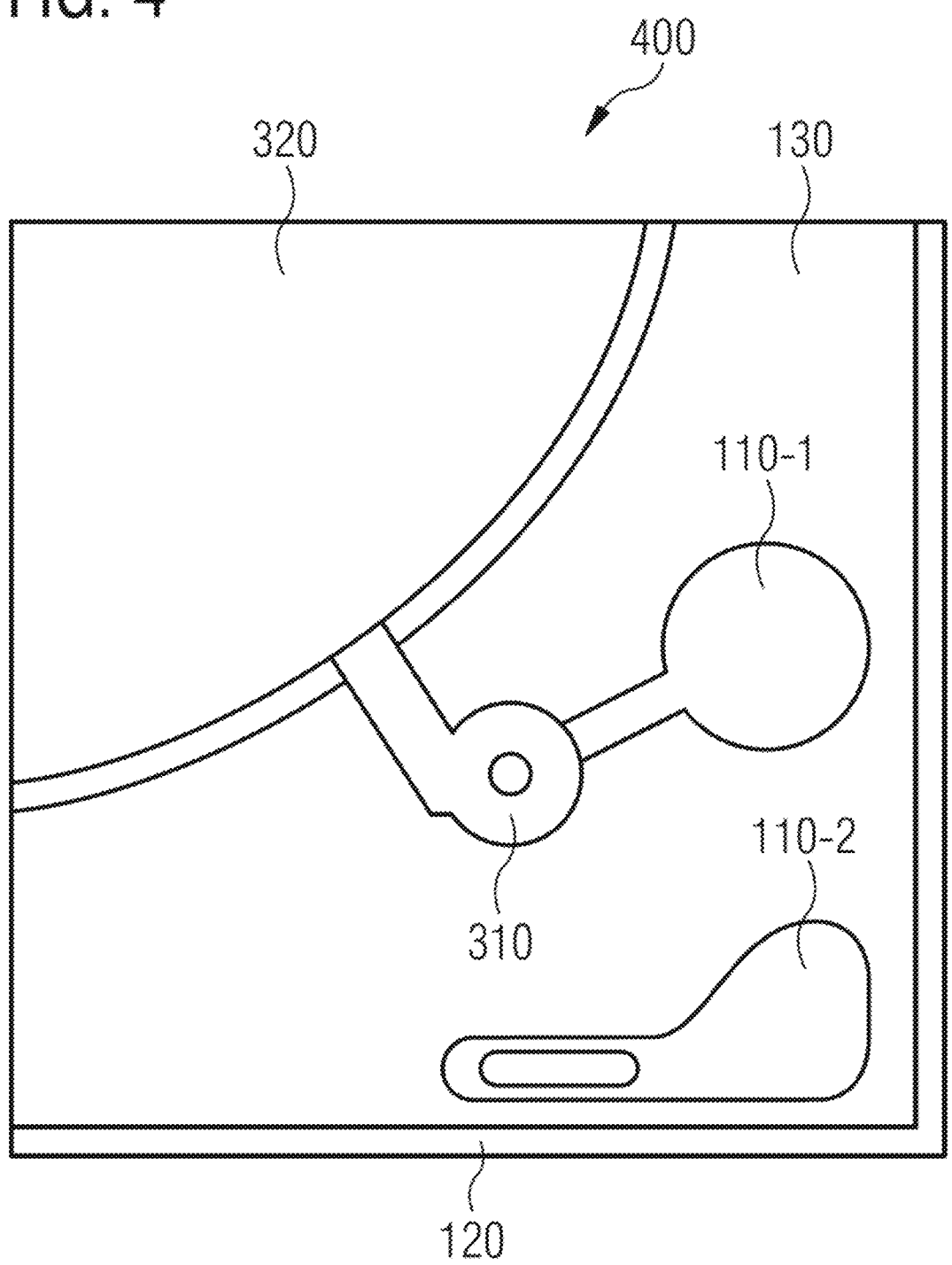
FIG. 4 shows a schematic plan view of part of a further microphone.

FIG. 4 shows a schematic plan view of part of a further microphone 400. The microphone can be embodied similarly to the microphone 300 described in association with FIG. 3. The microphone 400 comprises a semiconductor substrate 120. Two structured metal layers 110 are arranged above the semiconductor substrate 120. The structured metal layer 110-1 is connected to a membrane structure 320 of the microphone 400 via an electrical connection structure 310. In addition, the structured metal layer 110-2 is connected to a counterelectrode 340 (not depicted) of the microphone 400. By way of example, the structured metal layers 110 can form connection pads or terminal pads for the membrane structure 320 and the counterelectrode 340. Furthermore, a covering layer 130 lies adjacent to the front sides 11 of the structured metal layers 110 and adjacent to the side walls 112 of the structured metal layers 110. In addition, an oxide layer 210 (not depicted) can lie between the structured metal layers 110 and the semiconductor substrate.

FIG. 4 shows an example of preventing an FAEL attack on an aluminum (Al) metallization by means of tight amorphous silicon carbide (SiC).

Further details and aspects will be mentioned in association with the embodiments described above or below. The embodiment shown in FIG. 4 can comprise one or more optional additional features corresponding to one or more aspects mentioned in connection with the proposed concept or one or more of the embodiments described above (for example FIGS. 1-3) or below (for example FIGS. 5-6).

Figure 5:
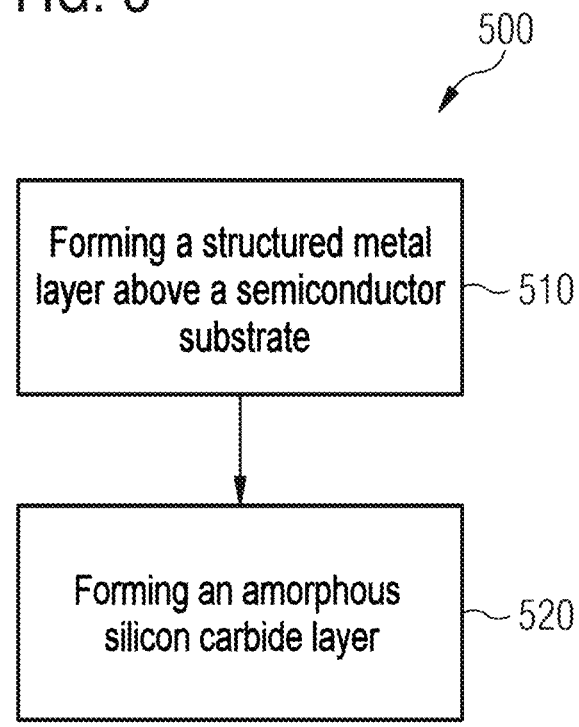
FIG. 5 shows a flow diagram of a method for forming a semiconductor device.

FIG. 5 shows a flow diagram of a method 500, for forming a semiconductor device. The method 500 comprises forming 510 a structured metal layer 110 above a semiconductor substrate 120. A thickness of the structured metal layer 110 is more than 100 nm (or more than 500 nm or more than 1 μm). In addition, the method 500 comprises forming 520 a covering layer 130 after forming 510 the structured metal layer 110, such that the covering layer 130 lies adjacent to a front side 111 of the structured metal layer 110 and adjacent to a side wall 112 of the structured metal layer 110. The covering layer 130 comprises amorphous silicon carbide.

A covering layer comprising amorphous silicon carbide can be produced particularly tightly and/or reliably in comparison with a covering layer composed of a different material. In addition, the use of amorphous silicon carbide as material for the covering layer 130 makes it possible to prevent a seam line from arising in the covering layer 130 at a transition between the front side 11 and the side wall 112 of the structured metal layer 110 or at a steep topography step of the covering layer 130 during the process of forming 520. As a result, improved protection of the structured metal layer 110 during a subsequent etching process can be brought about by means of the covering layer 130. It is thereby possible to avoid damage to the structured metal layer 110 during the etching process. As a result, a lifetime of the semiconductor device can be increased. Furthermore, the semiconductor device can be formed with a higher yield. In addition, on account of the reduced damage to the structured metal layer 110 during the etching process, the structured metal layer 110 can be formed from a cost-effective base metal. As a result, the semiconductor device can be formed cost-effectively. Furthermore, the covering layer 130 can be used as a passivation layer for the structured metal layer 110. Formation of an additional passivation layer can thereby be obviated. As a result, the semiconductor device can be formed cost-effectively.

By way of example, the semiconductor device 100 described in association with FIG. 1 and/or the semiconductor device 200 described in association with FIG. 2 can be formed by means of the method 500.

By way of example, forming 510 the structured metal layer 110 above the semiconductor substrate 120 can comprise depositing a metal layer on an insulation layer (for example an oxide layer 210 or a nitride layer) situated at the semiconductor substrate 120, and structuring the deposited metal layer. Structuring the deposited metal layer can comprise for example applying a mask on the deposited metal layer and etching the masked metal layer.

By way of example, forming 520 the covering layer 130 can be carried out at a temperature of less than 450° C. (or less than 400° C. or less than 350° C.). As a result, the structured metal layer 110 can be formed from a metal having a low melting point (for example from aluminum). The semiconductor device can thereby be formed cost-effectively.

By way of example, the covering layer 130 can be formed by means of plasma deposition. In addition, the plasma deposition can be carried out at a pressure of less than 70 kPa (or less than 50 kPa, less than 25 kPa, less than 10 kPa or less than 1 kPa) or of less than 500 torr (or less than 250 torr, less than 100 torr, less than 50 torr, less than 25 torr or less than 8 torr). As a result, it is possible to bring about an improved adhesion of the covering layer 130 to the structured metal layer 110 and/or an improved adhesion of the covering layer 130 to an oxide layer 210 against which the structured metal layer 110 bears. By way of example, the oxide layer 210 can be an oxide layer formed by means of a tetraethyl orthosilicate (TEOS) method. The plasma deposition can be for example a plasma-enhanced chemical vapor deposition (PECVD). By way of example, the covering layer 130 at a deposition temperature of less than or equal to 400° C. can form a tight film (for example on the structured metal layer 110) and serve as passivation and step protection. By way of example, the plasma deposition can comprise a capacitive plasma coupling into a parallel-plate capacitor of a plasma reactor. By way of example, methane can be used as a carbon source during the plasma deposition. By way of example, monosilane can be used as a silicon source during the plasma deposition.

By way of example, helium can be used as a dilution gas during the plasma deposition. As a result, it is possible to bring about a uniform deposition of the covering layer 130 on the structured metal layer 110 and a tighter attachment of the covering layer 130 to the structured metal layer 110. By way of example, a helium concentration during the plasma deposition can be more than 20% (or more than 30% or more than 50%). By way of example, during the plasma deposition, carbon atoms and silicon atoms can be present in the same concentration in the plasma reactor.

By way of example, amorphous silicon carbide (SiC) can be deposited in a plasma reactor which can also be used for a silicon nitride (Si3N4) deposition, for example. If the chemical composition is set in such a way that amorphous SiC is deposited, a film without seam lines can grow on steps with a steep side wall (for example on the structured metal layer 110). On account of the low deposition temperature during the SiC deposition, the process can be carried out after forming 510 the structured metal layer 110 (for example an aluminum (Al) metallization). In addition, in this process it is possible to achieve an excellent adhesion (for example of the covering layer 130) to the structured metal layer 110 (for example to aluminum) and to the oxide layer 210 (for example to a TEOS oxide).

By way of example, the covering layer 130 formed in the method step 520 can be a plasma-deposited, amorphous silicon carbide (SiC) film having excellent step coverage of 100% and the absence of seam lines on steep topography steps. Therefore, the covering layer 130 can be used as aluminum (Al) protection during subsequent FAEL etching. In addition, the material properties of the covering layer 130 may allow the latter to be used as a passivation replacement.

By way of example, the method 500 can furthermore comprise producing a membrane structure 320 of the semiconductor device. By way of example, the method 500 can furthermore comprise removing a sacrificial layer below the membrane structure 320 after forming 520 the covering layer 130 in order to form a cutout 330 below the membrane structure 320. By way of example, the sacrificial layer can be an oxide layer 210. In addition, removing the oxide layer 210 can be carried out by means of a buffered oxide etch. As a result, the oxide layer 210 can be removed without the covering layer 130 or the structured metal layer 110 being attacked. An etchant (for example FAEL) used during the buffered oxide etch can comprise hydrogen fluoride (HF) and/or hydrofluoric acid, for example.

By way of example, the method 500 can furthermore comprise nitriding the structured metal layer 110 before forming 520 the covering layer 130. A corrosion resistance of the structured metal layer 110 can be increased as a result.

By way of example, the method 500 can furthermore comprise wet-chemically cleaning the structured metal layer 110 before forming 520 the covering layer 130. An adhesion of the covering layer 130 to the structured metal layer 110 can be improved as a result.

Further details and aspects will be mentioned in association with the embodiments described above or below. The embodiment shown in FIG. 5 can comprise one or more optional additional features corresponding to one or more aspects mentioned in connection with the proposed concept or one or more of the embodiments described above (for example FIGS. 1-4) or below (for example FIG. 6).

Figure 6:
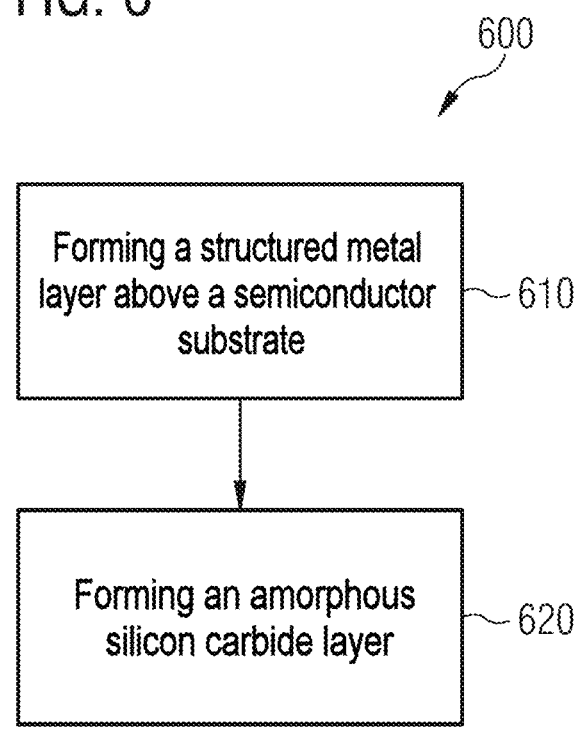
FIG. 6 shows a flow diagram of a further method for forming a semiconductor device.

FIG. 6 shows a flow diagram of a further method 600 for forming a semiconductor device. The method 600 comprises forming 610 a structured metal layer 110 above a semiconductor substrate 120. A thickness of the structured metal layer 110 is more than 100 nm (or more than 500 nm or more than 1 µm). In addition, the method 600 comprises forming 620 a covering layer 130 by means of plasma deposition after forming 610 the structured metal layer 110, such that the covering layer 130 lies adjacent to a front side 111 of the structured metal layer 110 and adjacent to a side wall 112 of the structured metal layer 110. Helium is used as dilution gas during the plasma deposition.

By using helium as dilution gas during the plasma deposition, it is possible for the covering layer 130 to be produced particularly tightly and/or reliably. In addition, it is possible to prevent a seam line from arising in the covering layer 130 at a transition between the front side 111 and the side wall 112 of the structured metal layer 110 or at a steep topography step of the covering layer 130. As a result, improved protection of the structured metal layer 110 during a subsequent etching process can be brought about by means of the covering layer 130. It is thereby possible to avoid damage to the structured metal layer 110 during the etching process. As a result, a lifetime of the semiconductor device can be increased. Furthermore, the semiconductor device can be formed with a higher yield. In addition, on account of the reduced damage to the structured metal layer 110 during the etching process, the structured metal layer 110 can be formed from a cost-effective base metal. As a result, the semiconductor device can be formed cost-effectively. Furthermore, the covering layer 130 can be used as a passivation layer for the structured metal layer 110. Formation of an additional passivation layer can thereby be obviated. As a result, the semiconductor device can be formed cost-effectively.

By way of example, the covering layer 130 can be a silicon nitride layer or comprise amorphous silicon carbide. The silicon nitride layer can contain for example at least 80% (or at least 90% or at least 95%) silicon nitride ($Si^3N^4$). By way of example, the semiconductor device 100 described in association with FIG. 1 and/or the semiconductor device 200 described in association with FIG. 2 can be formed by means of the method 600.

Forming 610 the structured metal layer 110 can be carried out in a manner similar to the process of forming 510 a structured metal layer 110 as described in association with FIG. 5. Forming 620 the covering layer 130 can be carried out in a manner similar to the process of forming 520 an amorphous silicon layer 130 as described in association with FIG. 5. In the case where the covering layer 130 is a silicon nitride layer, nitrogen ($N^2$) or ammonium ($NH^3$) can be used as a nitrogen source during the plasma deposition. By way of example, a helium concentration during the plasma deposition can be more than 20% (or more than 30% or more than 50%).

Further details and aspects will be mentioned in association with the embodiments described above or below. The embodiment shown in FIG. 6 can comprise one or more optional additional features corresponding to one or more aspects mentioned in connection with the proposed concept or one or more of the embodiments described above (for example FIGS. 1-5) or below.

Some embodiments relate to a use of amorphous silicon carbide for conformal side wall protection.

In accordance with one aspect, a change from a gold (Au) metallization to an aluminum (Al) metallization for MEMS products can be made possible by a use of amorphous silicon carbide (SiC) as step protection and passivation.

In accordance with one aspect, silicon carbide (SiC) can replace silicon nitride ($Si^3N^4$), can be impressive as equivalent passivation and can exhibit a superb tightness on steps with a steep side wall.

In accordance with one aspect, it is possible to use the covering layer in combination with an aluminum (Al) metallization for D-sound.

In accordance with one aspect, amorphous silicon carbide can be provided as a conformal material deposited at low temperature.

In accordance with one aspect, the covering layer can form a tight film for blocking ions and impurity substances.

In accordance with one aspect, the covering layer can have a hard amorphous silicon carbide modification.

In accordance with one aspect, a covering layer within a semiconductor device or a MEMS product can be detected and/or measured by energy dispersive X-ray spectroscopy (EDX), infrared spectroscopy, X-ray photoelectron spectroscopy (XPS) and/or secondary ion mass spectrometry (SIMS, or "time-of-flight secondary ion mass spectrometry", TOF SIMS).

Advantages of some of the disclosed embodiments include a longer lifetime and/or a higher yield for semiconductor devices.

The features disclosed in the description above, the following claims and the accompanying figures may be of importance and implemented both individually and in any desired combination for the realization of an exemplary embodiment in the various configurations thereof.

Although some aspects have been described in association with a device, it goes without saying that these aspects also constitute a description of the corresponding method, such that a block or a component of a device should also be understood as a corresponding method step or as a feature of a method step. Analogously thereto, aspects that have been described in association with or as a method step also constitute a description of a corresponding block or detail or feature of a corresponding device.

Generally, exemplary embodiments of the present invention may be implemented as a program, firmware, a computer program or a computer program product comprising a program code or as data, wherein the program code or the data is or are effective for carrying out one of the methods when the program runs on a processor or a programmable hardware component. The program code or the data may for example also be stored on a machine readable carrier or data carrier. The program code or the data may be present, inter alia, as source code, machine code or byte code and as other intermediate code. The data carrier may be a digital storage medium, a magnetic storage medium, for example a floppy disk, a magnetic tape, or a hard disk, or an optically readable digital storage medium. A programmable hardware component may be formed by a processor, a central processing unit (CPU), a graphics processing unit (GPU), a computer, a computer system, an application specific integrated circuit (ASIC), an integrated circuit (IC), a system on chip (SOC), a programmable logic element or a field programmable gate array (FPGA) with a microprocessor.

Only the principles of the disclosure are presented by the description and drawings. It therefore goes without saying that the person skilled in the art may derive different arrangements which, even though they are not expressly described or illustrated here, embody the principles of the disclosure and are contained in the essence and scope of protection thereof. Furthermore, all examples presented here are intended to be used, in principle, only for teaching purposes in order to assist the reader in understanding the principles of the disclosure and the concepts contributed by the inventor(s) for further development of the art, and should be interpreted as serving not to limit such specially presented examples and conditions. Furthermore, all statements herein regarding principles, aspects and examples of the disclosure as well as particular examples thereof are intended to encompass the equivalents thereof.

A block diagram may for example illustrate a conceptual view of an exemplary circuit embodied by the principles of the disclosure. In a similar manner it goes without saying that all flow charts, flow diagrams, state transition diagrams, pseudo code and the like represent various processes which are substantially represented in a computer readable medium and thus implemented by a computer or processor, irrespective of whether such a computer or processor is expressly illustrated. The methods disclosed in the description or in the claims may be carried out by means of a device comprising means for carrying out each of the respective steps of said methods.

Furthermore, it goes without saying that the disclosure of multiple actions or functions disclosed in the description or the claims should not be interpreted as being in the specific order. The disclosure of multiple actions or functions therefore does not limit them to a specific order, unless said actions or functions are not interchangeable for technical reasons. Furthermore, in some examples, a single action may include or be broken down into a plurality of sub actions. Such sub actions may be included and form part of the disclosure of said single action, provided that they are not expressly excluded.

Furthermore, the following claims are hereby incorporated in the detailed description, where each claim may represent a separate example by itself. If each claim may represent a separate example by itself, it should be noted that—even though in the claims a dependent claim may refer to a particular combination with one or more other claims—other examples may also include a combination of the dependent claim with the subject matter of any other dependent or independent claim. These combinations are proposed here, provided that there is no indication that a specific combination is not intended. Furthermore, features of a claim are also intended to be included for any other independent claim, even if said claim is not made directly dependent on the independent claim.

What is claimed is:

1. A method for forming a semiconductor device, the method comprising:
   forming a structured metal layer above a semiconductor substrate, wherein a thickness of the structured metal layer is more than 100 nm; and
   forming a covering layer after forming the structured metal layer, such that the covering layer lies adjacent to a front side of the structured metal layer and adjacent to a side wall of the structured metal layer, wherein the covering layer comprises amorphous silicon carbide doped or alloyed with chromium (Cr).

2. The method as claimed in claim 1, wherein forming the covering layer is carried out at a temperature of less than 450° C.

3. The method as claimed in claim 1, wherein the covering layer is formed by performing a plasma deposition, and wherein the plasma deposition is carried out at a pressure of less than 70 kPa.

4. The method as claimed in claim 3, wherein helium is used as dilution gas during the plasma deposition.

5. The method as claimed in claim 4, wherein a helium concentration during the plasma deposition is more than 20%.

6. The method as claimed in claim 1, further comprising producing a membrane structure of the semiconductor device.

7. The method as claimed in claim 6, further comprising removing a sacrificial layer below the membrane structure after forming the covering layer in order to form a cutout below the membrane structure.

8. The method as claimed in claim 7, wherein the sacrificial layer is an oxide layer, and wherein removing the oxide layer is carried out by performing a buffered oxide etch.

9. The method as claimed in claim 1, furthermore comprising wet-chemically cleaning the structured metal layer before forming the covering layer.

10. A method for forming a semiconductor device, the method comprising:
    forming a structured metal layer above a semiconductor structure, wherein a thickness of the structured metal layer is more than 100 nm; and
    forming a covering layer by performing a plasma deposition after forming the structured metal layer, wherein the covering layer lies adjacent to a front side of the structured metal layer and adjacent to a side wall of the structured metal layer, wherein helium is used as a dilution gas during the plasma deposition, and wherein the covering layer comprises a multilayer structure comprising a plurality of amorphous silicon carbide layers, and wherein the covering layer is doped or alloyed with chromium (Cr).

11. A method for forming a semiconductor device, the method comprising:
    forming a structured metal layer above a semiconductor substrate; and
    forming a covering layer after forming the structured metal layer, such that the covering layer lies adjacent to a front side of the structured metal layer and adjacent to a side wall of the structured metal layer, wherein a central part of the front side of the structured metal layer is not covered by the covering layer, and wherein the covering layer comprises amorphous silicon carbide doped or alloyed with chromium (Cr).

12. The method as claimed in claim 11, wherein forming the covering layer is carried out at a temperature of less than 450° C.

13. The method as claimed in claim 11, wherein the covering layer is formed by performing a plasma deposition, and wherein the plasma deposition is carried out at a pressure of less than 70 kPa.

14. The method as claimed in claim 13, wherein helium is used as dilution gas during the plasma deposition.

15. The method as claimed in claim 14, wherein a helium concentration during the plasma deposition is more than 20%.

16. The method as claimed in claim 11, further comprising producing a membrane structure of the semiconductor device.

17. The method as claimed in claim 16, further comprising removing a sacrificial layer below the membrane structure after forming the covering layer in order to form a cutout below the membrane structure.

18. The method as claimed in claim 17, wherein the sacrificial layer is an oxide layer, and wherein removing the oxide layer is carried out by performing a buffered oxide etch.

19. The method as claimed in claim 11, furthermore comprising wet-chemically cleaning the structured metal layer before forming the covering layer.

20. The method as claimed in claim 11, wherein a thickness of the structured metal layer is more than wo nm.

* * * * *

UNITED STATES PATENT AND TRADEMARK OFFICE
CERTIFICATE OF CORRECTION

PATENT NO. : 11,352,253 B2
APPLICATION NO. : 17/024029
DATED : June 7, 2022
INVENTOR(S) : Kahn et al.

It is certified that error appears in the above-identified patent and that said Letters Patent is hereby corrected as shown below:

In the Claims

Claim 20, Column 14, Line 46; delete "wo" and insert --100--.

Signed and Sealed this
Twentieth Day of September, 2022

Katherine Kelly Vidal
*Director of the United States Patent and Trademark Office*